US007821299B2

(12) United States Patent
Liu

(10) Patent No.: US 7,821,299 B2
(45) Date of Patent: Oct. 26, 2010

(54) MATRIX DECODER

(75) Inventor: Shang-I Liu, Kaohsiung (TW)

(73) Assignee: Novatek Microelectronics Corp., Hsinchu (TW)

( * ) Notice: Subject to any disclaimer, the term of this patent is extended or adjusted under 35 U.S.C. 154(b) by 1072 days.

(21) Appl. No.: 11/532,913

(22) Filed: Sep. 19, 2006

(65) Prior Publication Data

US 2007/0103346 A1 May 10, 2007

(30) Foreign Application Priority Data

Nov. 4, 2005 (TW) .............................. 94138720 A

(51) Int. Cl.
*G11C 8/00* (2006.01)
*H03K 19/082* (2006.01)
*H03K 19/094* (2006.01)

(52) U.S. Cl. ........................ 326/105; 326/106; 326/108

(58) Field of Classification Search .......... 326/105–108
See application file for complete search history.

(56) References Cited

U.S. PATENT DOCUMENTS 4,344,005 A * 8/1982 Stewart ...................... 326/108
2010/0007643 A1* 1/2010 Wu et al. .................... 345/211

OTHER PUBLICATIONS

Rhyne, Fundamentals of Digital Systems Design, N.J., 1973, pp. 70-71.*

* cited by examiner

*Primary Examiner*—Anh Q Tran
(74) *Attorney, Agent, or Firm*—Jianq Chyun IP Office

(57) ABSTRACT

A matrix decoder is provided, which includes a plurality of first level shifters, a plurality of second level shifters, and a demultiplexer. The first level shifters and the second level shifters boost the voltages of inputted signals to the voltages required by high voltage components and output the boosted signals. One of the first level shifters receives a first logic state and outputs a fifth logic state. Each of the other first level shifters receives a second logic state and outputs a sixth logic state. One of the second level shifters receives a third logic state and outputs a seventh logic state. Each of the other second level shifters receives a fourth logic state and outputs an eighth logic state. The demultiplexer outputs a ninth logic state and a plurality of tenth logic states according to the logic states outputted by the first level shifters and the second level shifters.

14 Claims, 5 Drawing Sheets

MATRIX DECODER

CROSS-REFERENCE TO RELATED APPLICATION

This application claims the priority benefit of Taiwan application serial no. 94138720, filed Nov. 4, 2005. All disclosure of the Taiwan application is incorporated herein by reference.

BACKGROUND OF THE INVENTION

1. Field of Invention

The present invention relates to a matrix decoder. More particularly, the present invention relates to a matrix decoder including level shifters.

2. Description of Related Art

FIG. 1 is a schematic block diagram of a conventional gate driver 100 which is applicable to a liquid crystal display panel. The decoder 101 has a plurality of output terminals, each output terminal is coupled with a level shifter and an output stage and is eventually coupled to one of the gate lines G1~Gm.

The decoder 101 receives control signals X0~Xn, and the control signals X0~Xn indicate which gate line is to be turned on. For example, if the gate line G1 is to be turned on, the decoder 101 outputs logic 1 to the level shifter 102 and logic 0 to the other level shifters after decoding the control signals X0~Xn. Next, each of the level shifters boosts the voltage of the input signal to the voltage required by high voltage component, and then outputs the boosted signal to the corresponding output stage, so that the gate line G1 is turned on because of logic 1 and the other gate lines are turned off because of logic 0.

The aforementioned decoder 101 is formed by low voltage components; the level shifters 102 include low, middle, and high voltage components, wherein most components are high voltage components; and the output stages 103 all use high voltage components. Since the level shifters and the output stages require high voltage process, and the numbers thereof are the same as that of the output terminals of the gate driver, the surface area of the conventional gate driver cannot be reduced due to the large number of high voltage metal oxide semiconductor field effect transistors (MOSFETs).

SUMMARY OF THE INVENTION

Accordingly, the present invention is directed to provide a matrix decoder, which is applicable to the gate driver of an LCD panel. The number of high voltage MOSFETs can be reduced greatly, so as to minimize the surface area of the circuit, without affecting the function of the circuit. Moreover, compared to the conventional structure, the matrix decoder provided by the present invention has the same electro-static discharge (ESD) protection performance and driving performance with no additional static current consumption.

To achieve the aforementioned and other objectives, the present invention provides a matrix decoder, which includes a plurality of first level shifters, a plurality of second level shifters, and a demultiplexer. The first and the second level shifters boost the voltages of the input signals to the voltages required by high voltage components and output the boosted signals. One of the first level shifters receives a first logic state and outputs a fifth logic state. Each of the other first level shifters receives a second logic state and outputs a sixth logic state. One of the second level shifters receives a third logic state and outputs a seventh logic state. Each of the other second level shifters receives a fourth logic state and outputs an eighth logic state. The demultiplexer outputs a ninth logic state and a plurality of tenth logic states according to the logic states output by the first level shifters and the second level shifters.

In an embodiment, the aforementioned matrix decoder further includes a first pre-decoder and a second pre-decoder. The first pre-decoder outputs a first logic state to one of the first level shifters and a second logic state to the other first level shifters according to a first control signal. The second pre-decoder outputs a third logic state to one of the second level shifters and a fourth logic state to the other second level shifters according to a second control signal.

In the aforementioned matrix decoder according to an embodiment, the demultiplexer includes a plurality of logic units. Each of the logic units is coupled to one of the first level shifters and one of the second level shifters. If a logic unit receives the fifth logic state and the seventh logic state, then it outputs the ninth logic state; otherwise, it outputs the tenth logic state.

In an embodiment, the aforementioned matrix decoder further includes a plurality of output stages, and each of the output stages is coupled to one of the logic units.

In another embodiment, the aforementioned matrix decoder further includes a plurality of output stages, and each of the output stages is coupled between one of the first level shifters and a plurality of logic units.

According to an exemplary embodiment of the present invention, the aforementioned matrix decoder uses two pre-decoders to divide the original control signals into two sections, and by integrating with the logic units arranged as a matrix in the demultiplexer, the large number of gate lines can share the relatively small number of level shifters and output stages. Accordingly, the present invention greatly reduces the number of high voltage MOSFETs, so as to minimize the circuit area without affecting the function of the circuit. Moreover, compared to the conventional structure, the signal transmission path of the aforementioned matrix decoder is substantially the same. Thus, the matrix decoder provided by the present invention has the same ESD protection performance and driving performance with no additional static current consumption.

In addition, besides being applied in the gate driver of LCD panel, the aforementioned matrix decoder can also be applied to other circuits or apparatuses which require decoding and voltage boosting functions.

In order to make the aforementioned and other objects, features and advantages of the present invention comprehensible, a preferred embodiment accompanied with figures is described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Generally, when a typical gate driver is under normal operation, only one gate line thereof will output logic 1 while the other gate lines thereof output logic 0. Thus, at any time, only one level shifter and one output stage are in action. In the present invention, the original decoder and the control signals thereof are divided into two sections based on this characteristic of the gate driver.

Figure 1:
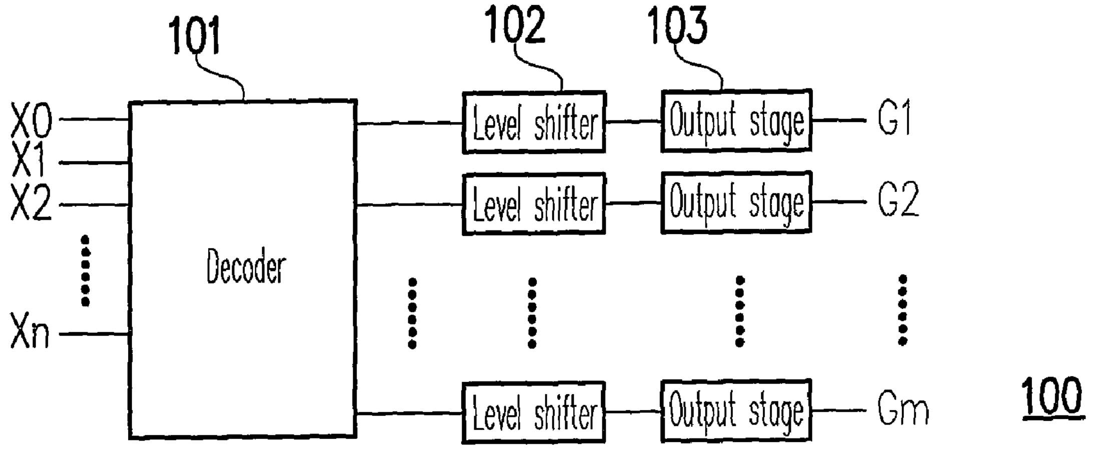
FIG. 1 (PRIOR ART)
FIG. 1 is a schematic block diagram of a conventional gate driver.
Figure 2:
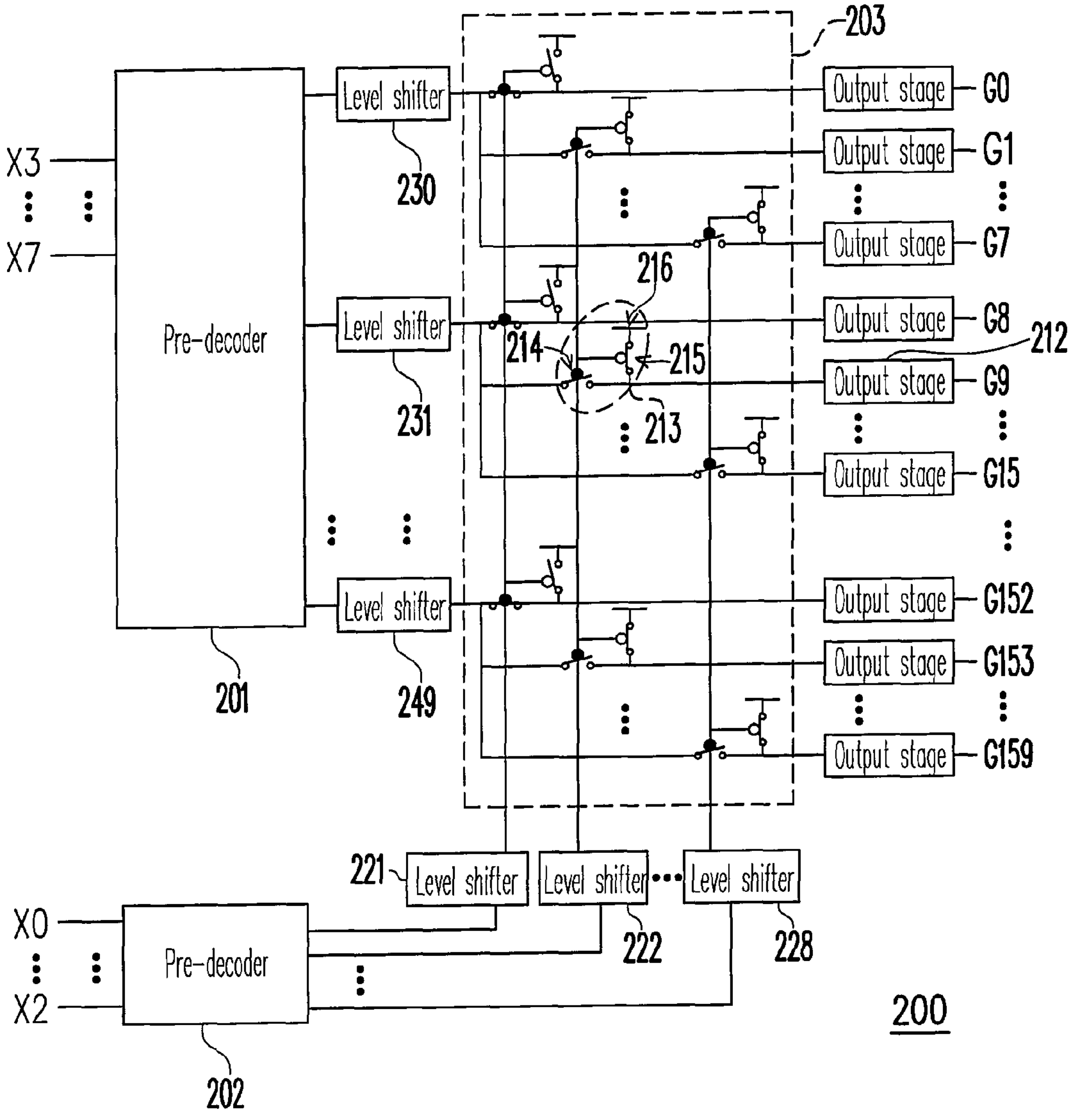
FIG. 2 is a schematic block diagram of a matrix decoder according to an embodiment of the present invention.

FIG. 2 is a schematic block diagram of a matrix decoder 200 according to an embodiment of the present invention. The matrix decoder 200 is a portion of the gate driver of an LCD panel, which includes pre-decoders 201 and 202, 28 level shifters (230~249, 221~228), a demultiplexer 203, and 160 output stages (e.g. output stage 212). The pre-decoders 201 and 202 are formed by low voltage components; the level shifters 230~249 and 221~228 include low, middle, and high voltage components, wherein most components are high voltage components; and the demultiplexer 203 and the output stages (e.g. 212) all use high voltage components. Wherein, the level shifters are divided into two groups: the first group of level shifters 230~249 receive the output of the pre-decoder 201 and the second group of level shifters 221~228 receive the output of the pre-decoder 202.

The pre-decoder 201 outputs a first logic state to one of the first level shifters 230~249 and outputs a second logic state to the other first level shifters according to the control signals X3~X7. The pre-decoder 202 outputs a third logic state to one of the second level shifters 221~228 and outputs a fourth logic state to the other second level shifters according to the control signals X0~X2. Both the function of the first level shifters 230~249 and the function of the second level shifters 221~228 are to boost the voltages of the inputted signals to the voltages required by high voltage components and to output the boosted signals. One of the first level shifters 230~249 receives a first logic state and outputs a fifth logic state, each of the other first level shifters receives a second logic state and outputs a sixth logic state. Similarly, one of the second level shifters 221~228 receives a third logic state and outputs a seventh logic state, and each of the other second level shifters receives a fourth logic state and outputs an eighth logic state.

In the present embodiment, the first logic state is one of logic 1 and logic 0, and the second logic state is the other one of logic 1 and logic 0. The third logic state is also one of logic 1 and logic 0, and the fourth logic state is the other one of logic 1 and logic 0. The fifth and the sixth logic states, and the seventh and the eighth logic states may be deduced by analogy. Thus the logic states can be combined variously, for example, both the first and the third logic states are logic 1, and both the second and the fourth logic states are logic 0; or both the first and the fourth logic states are logic 1, and both the second and the third logic states are logic 0 and so on. The first, third, fifth, and seventh logic states are used for turning on the gate lines, and the second, fourth, sixth, and eighth logic states are used for turning off the gate lines.

Each output stage of the matrix decoder 200 is coupled to one of the 160 gate lines G0~G159. In other words, the output stages correspond to the gate lines G0~G159 one by one. In the present embodiment, each output stage is formed by at least one inverter.

The demultiplexer 203 outputs a ninth logic state to one of the 160 output stages and a tenth logic state to the other output stages according to the logic states outputted by the first level shifters 230~249 and the second level shifters 221~228. The ninth logic state of the present embodiment is one of logic 1 and logic 0, and the tenth logic state is the other one of logic 1 and logic 0. The ninth logic state is used for turning on the gate lines and the tenth logic state is used for turning off the gate lines.

In the present embodiment, the control signals X0~X7 used for selecting gate lines are divided into two sections: the control signals X3~X7 are the five most significant bits (MSB) thereof, and the control signals X0~X2 are the three least significant bits (LSB) thereof. After decoding by the pre-decoders 201 and 202, the pre-decoder 201 outputs the first logic state to only one of the level shifters 230~249, and the pre-decoder 202 outputs the third logic state to only one of the level shifters 221~228. The demultiplexer 203 includes 160 logic units (e.g. logic unit 213) arranged as a matrix. When the aforementioned logic states are boosted by the level shifters, the first logic state becomes the fifth logic state, the third logic state becomes the seventh logic state, and the logic unit at the intersection of the fifth logic state and the seventh logic state outputs the ninth logic state to turn on the gate lines selected by the control signals X0~X7. The other logic units output the tenth logic state to turn off the other gate lines.

The demultiplexer 203 includes 160 logic units. Wherein, each of the logic units is coupled to one of the first level shifters 230~249, one of the second level shifters 221~228, and one of the 160 output stages. If the first level shifter corresponding to one logic unit outputs the fifth logic state, and the second level shifter corresponding to the logic unit outputs the seventh logic state, then the logic unit outputs the ninth logic state to the corresponding output stage, otherwise the logic unit outputs the tenth logic state to the corresponding output stage.

Each logic unit of the demultiplexer 203 has the same structure and function, and for the convenience of description, the logic unit 213 will be explained as an example below.

The logic unit 213 is coupled to the level shifters 231, 222, and the output stage 212 which includes switches 214 and 215. The switch 214 is coupled between the level shifter 231 and the output terminal of the logic unit 213. If the level shifter 222 outputs the seventh logic state, then the switch 214 is turned on, otherwise the switch 214 is turned off. On the other hand, the switch 215 is coupled between the voltage source 216 and the output terminal of the logic unit 213. If the level shifter 222 outputs the eighth logic state, then the switch 215 is turned on, otherwise the switch 215 is turned off. The voltage source 216 remains at the tenth logic state, which is because the gate lines are not floating and have to remain at the voltage level of the tenth logic state when they are turned off. In the present embodiment, the switches 214 and 215 are both formed by high voltage MOSFETs.

As described above, if the level shifter 222 outputs the seventh logic state, the switch 214 is turned on and the switch 215 is turned off, so that the logic unit 213 outputs the logic state outputted by the level shifter 231 to the output stage 212. Contrarily, if the level shifter 222 outputs the eighth logic state, the switch 214 is turned off and the switch 215 is turned on, so that the logic unit 213 outputs the tenth logic state to the output stage 212. In other words, the logic unit 213 outputs the ninth logic state to the gate line G9 only when the level shifter 231 outputs the fifth logic state and the level shifter 222 outputs the seventh logic state, otherwise the logic unit 213 outputs the tenth logic state to the gate line G9.

In the conventional structure, the 160 gate lines need 160 level shifters. In the present embodiment, the 160 gate lines can share 28 level shifters because of the switch matrix contained in the demultiplexer 203, which is 82.5% less than in the conventional structure. Taking out the 160 logic units can further reduce at least 40% of the surface area of the high voltage components. Moreover, the bit numbers of the control signals of the pre-decoders 201 and 202 can be selected to achieve maximum area reduction, as explained below. It is assumed that the matrix decoder 200 driving 160 gate lines is the fixed condition.

If a control signal of the pre-decoder 202 has 2 bits, then the matrix decoder 200 needs $160/2^2+2^2=44$ level shifters in total.

If a control signal of the pre-decoder 202 has 3 bits, then the matrix decoder 200 needs $160/2^3+2^3=28$ level shifters in total, as shown in FIG. 2.

If a control signal of the pre-decoder 202 has 4 bits, then the matrix decoder 200 needs $160/2^4+2^4=26$ level shifters in total.

If a control signal of the pre-decoder 202 has 5 bits, then the matrix decoder 200 needs $160/2^5+2^5=37$ level shifters in total.

It can be seen that the matrix decoder 200 can achieve the maximum area reduction when the control signal of the pre-decoder 202 has 4 bits. This kind of circuit structure can be designed easily by those with ordinary skill in the art, so will not be described again.

Figure 3:
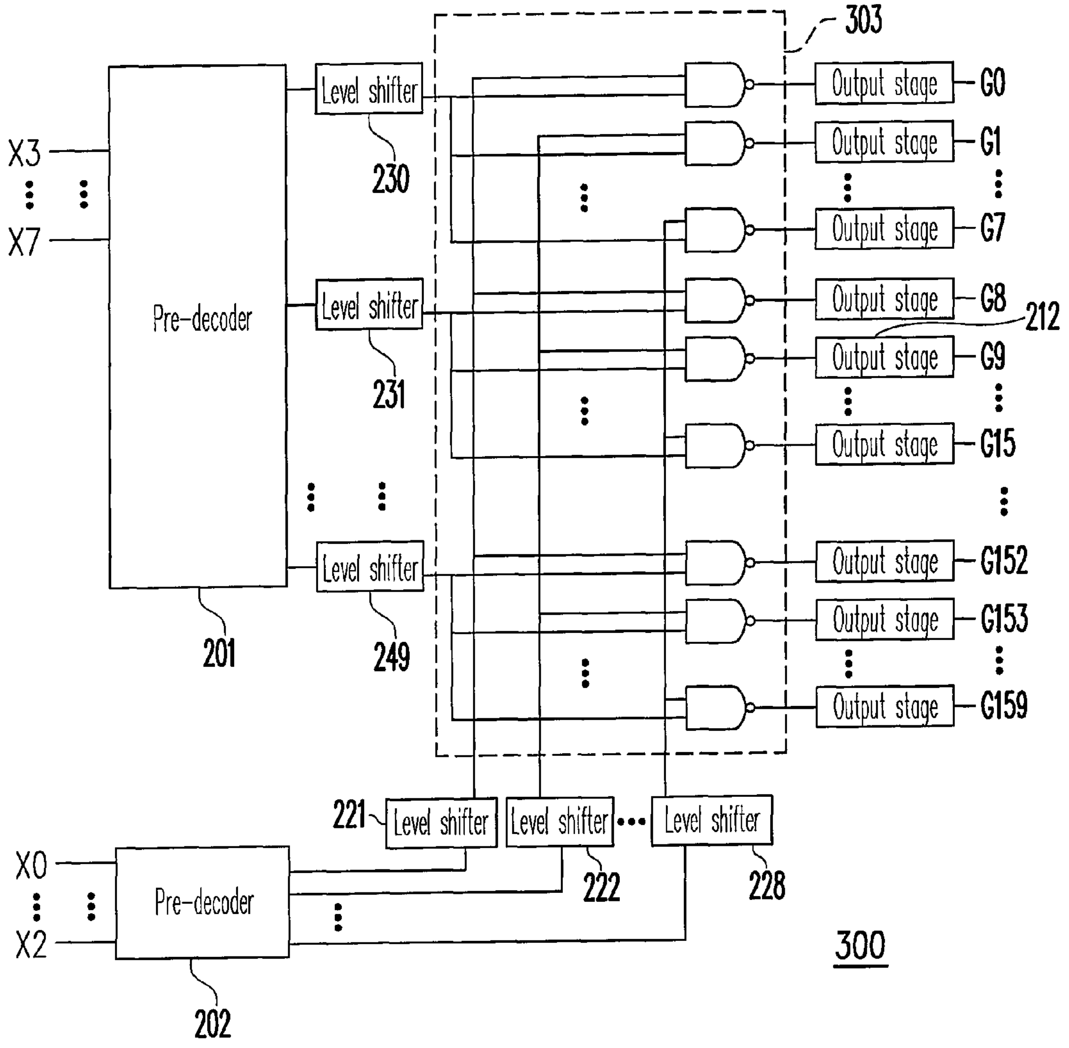
FIGS. 3 to 5 are schematic block diagrams of other matrix decoders according to other embodiments of the present invention.

FIG. 3 is a schematic block diagram of a matrix decoder 300 according to another embodiment of the present invention. The main difference of the matrix decoder 300 from the matrix decoder 200 is that the demultiplexer 203 is changed to the demultiplexer 303. Each of the logic units of the demultiplexer 303 is an NAND gate. If both the corresponding first level shifter and the corresponding second level shifter output logic 1 (the fifth and the seventh logic states), then the logic unit outputs logic 0 (the ninth logic state) to the output stage, otherwise the logic unit outputs logic 1 (the tenth logic state) to the output stage.

Figure 4:
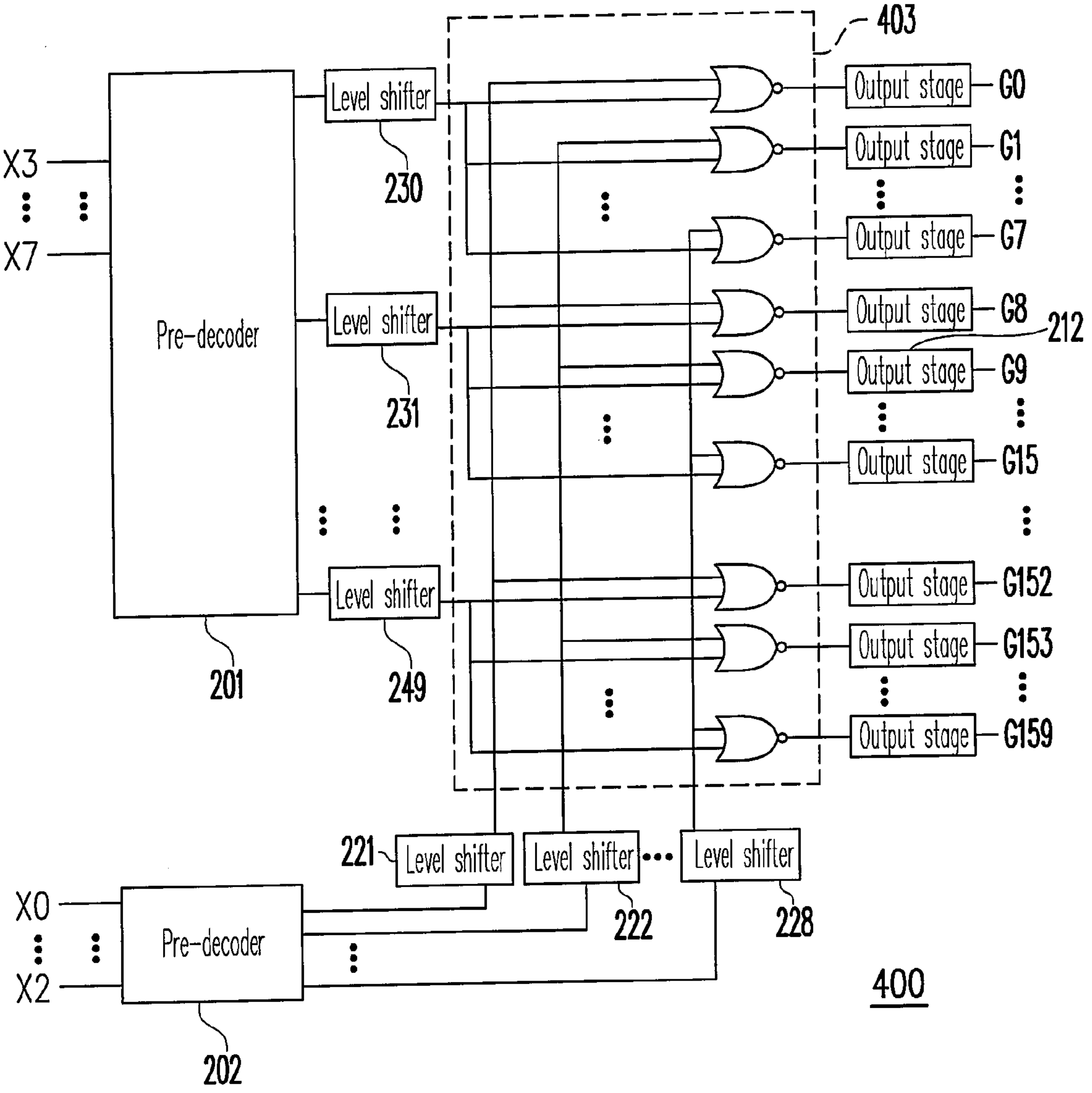

FIG. 4 is a schematic block diagram of a matrix decoder 400 according to another embodiment of the present invention. The main difference of the matrix decoder 400 from the matrix decoder 200 is that the demultiplexer 203 is changed to the demultiplexer 403. Each of the logic units of the demultiplexer 403 is an NOR gate. If both the corresponding first level shifter and the corresponding second level shifter output logic 0 (the fifth and the seventh logic states), then the logic unit outputs logic 1 (the ninth logic state) to the output stage, otherwise the logic unit outputs logic 0 (the tenth logic state) to the output stage.

Figure 5:
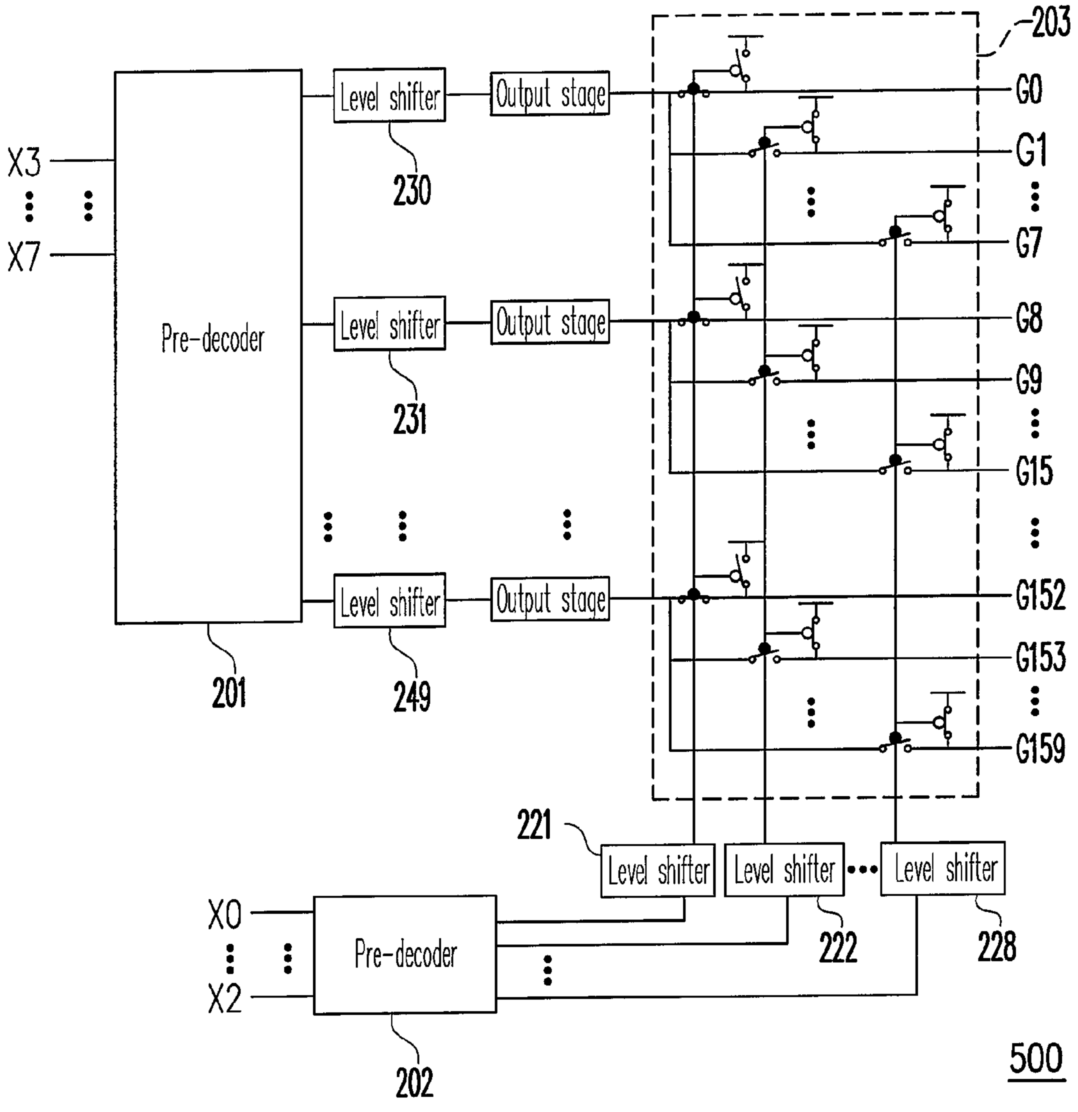

Finally, FIG. 5 is a schematic block diagram of a matrix decoder 500 according to another embodiment of the present invention. The main difference between the matrix decoder 500 and the matrix decoder 200 is that the output stages of the matrix decoder 200 are located between the demultiplexer 203 and the gate lines. G0~G159, while the output stages of the matrix decoder 500 are located between the first level shifters 230~249 and the demultiplexer 203. Since even the output stages are shared in the matrix decoder 500, the output stages can be reduced from 160 to 20 to further reduce the number and area of the high voltage components. The output stages in the embodiments shown in FIGS. 3 and 4 can be adjusted in the same way.

In the embodiment described above, the logic states produced by the LSB control signals X0~X2 determine whether the logic states produced by the MSB control signals X3~X7 are transmitted to the corresponding gate lines. In other embodiments of the present invention, the functions of the two groups of control signals can be exchanged, that is, the logic states produced by the MSB control signals X3~X7 determine whether, the logic states produced by the LSB control signals X0~X2 are transmitted to the corresponding gate lines.

The parameters in the embodiments described above, e.g. the bit numbers of the two groups of control signals and the number of gate lines, can be adjusted conveniently by those with ordinary skill in the art based on the above descriptions to meet the requirements of various applications. Furthermore, the modified matrix decoder keeps the advantages and functions of the present invention.

Finally, there is another variation of the aforementioned embodiments, which omits the two pre-decoders. Thus, the purpose of reducing high voltage components can still be achieved even though external pre-decoders or other method to provide the input signals of the level shifters are needed.

In overview, according to the matrix decoder of the present invention, two pre-decoders are used to divide the original control signals into two sections, and by integrating with the logic units arranged as a matrix in the demultiplexer, the large number of gate lines can share the relatively small number of level shifters and output stages. Thus, according to the present invention, the number of high voltage MOSFETs can be reduced considerably without affecting the function of the circuit, so as to reduce the area of the circuit. In addition, compared to the conventional gate driver, the signal transmission path of the aforementioned matrix decoder is substantially the same. Accordingly, the matrix decoder provided by the present invention has the same electro-static discharge protection performance and driving performance with no additional static current consumption.

In addition, besides being applied in the gate driver of LCD panel, the aforementioned matrix decoder can also be applied to other circuits or apparatuses which require decoding and voltage boosting functions. If the buffering and driving functions are not required in the application, the output stages in the aforementioned matrix decoder can be skipped.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A matrix decoder, comprising:

a plurality of first level shifters, used for boosting the voltages of inputted signals to the voltages required by high voltage components and outputting the boosted signals, one of the first level shifters receiving a first logic state and outputting a fifth logic state, each of the other first level shifters receiving a second logic state and outputting a sixth logic state;

a plurality of second level shifters, used for boosting the voltages of inputted signals to the voltages required by high voltage components and outputting the boosted signals, one of the second level shifters receiving a third logic state and outputting a seventh logic state, each of the other second level shifters receiving a fourth logic state and outputting an eighth logic state; and a demultiplexer, used for outputting a ninth logic state and a plurality of tenth logic states according to the logic states outputted by the first level shifters and the second level shifters, wherein the demultiplexer includes a plurality of logic units; each of the logic units is coupled to one of the first level shifters and one of the second level shifters; if one of the logic units receives the fifth logic state and the seventh logic state, then the logic unit outputs the ninth logic state, otherwise the logic unit outputs the tenth logic state; and a plurality of output stages, each of the output stages being coupled to one of the logic units.

2. The matrix decoder as claimed in claim 1 further comprising:

a first pre-decoder, used for outputting the first logic state to one of the first level shifters and outputting the second logic state to the other first level shifters according to a first control signal; and a second pre-decoder, used for outputting the third logic state to one of the second level shifters and outputting the fourth logic state to the other second level shifters according to a second control signal.

3. The matrix decoder as claimed in claim 1, wherein each of the output stages is formed by at least one inverter.

4. The matrix decoder as claimed in claim 1, wherein if the second level shifter corresponding to one of the logic units outputs the seventh logic state, then the logic unit outputs the logic state outputted by the corresponding first level shifter; if the second level shifter outputs the eighth logic state, then the logic unit outputs the tenth logic state.

5. The matrix decoder as claimed in claim 4, wherein the logic unit comprises:

a first switch, coupled between the first level shifter and the output terminal of the logic unit, the first switch being turned on if the second level shifter outputting the seventh logic state, otherwise the first switch being turned off; and a second switch, coupled between a voltage source and the output terminal of the logic unit, the second switch being turned on if the second level shifter outputting the eighth logic state, otherwise the second switch being turned off, the voltage source remaining at the tenth logic state.

6. The matrix decoder as claimed in claim 1, wherein each of the logic units is an NAND gate.

7. The matrix decoder as claimed in claim 1, wherein each of the logic units is an NOR gate.

8. The matrix decoder as claimed in claim 1, wherein the first logic state is one of logic 1 and logic 0, and the second logic state is the other one of logic 1 and logic 0.

9. The matrix decoder as claimed in claim 1, wherein the third logic state is one of logic 1 and logic 0, and the fourth logic state is the other one of logic 1 and logic 0.

10. The matrix decoder as claimed in claim 1, wherein the fifth logic state is one of logic 1 and logic 0, and the sixth logic state is the other one of logic 1 and logic 0.

11. The matrix decoder as claimed in claim 1, wherein the seventh logic state is one of logic 1 and logic 0, and the eighth logic state is the other one of logic 1 and logic 0.

12. The matrix decoder as claimed in claim 1, wherein the ninth logic state is one of logic 1 and logic 0, and the tenth logic state is the other one of logic 1 and logic 0.

13. A matrix decoder, comprising:

a plurality of first level shifters, used for boosting the voltages of inputted signals to the voltages required by high voltage components and outputting the boosted signals, one of the first level shifters receiving a first logic state and outputting a fifth logic state, each of the other first level shifters receiving a second logic state and outputting a sixth logic state;

a plurality of second level shifters, used for boosting the voltages of inputted signals to the voltages required by high voltage components and outputting the boosted signals, one of the second level shifters receiving a third logic state and outputting a seventh logic state, each of the other second level shifters receiving a fourth logic state and outputting an eighth logic state; and a demultiplexer, used for outputting a ninth logic state and a plurality of tenth logic states according to the logic states outputted by the first level shifters and the second level shifters, wherein the demultiplexer includes a plurality of logic units; each of the logic units is coupled to one of the first level shifters and one of the second level shifters; if one of the logic units receives the fifth logic state and the seventh logic state, then the logic unit outputs the ninth logic state, otherwise the logic unit outputs the tenth logic state; and a plurality of output stages, each of the output stages being coupled between one of the first level shifters and a plurality of the logic units.

14. A matrix decoder, comprising:

a plurality of first level shifters, used for boosting the voltages of inputted signals to the voltages required by high voltage components and outputting the boosted signals, one of the first level shifters receiving a first logic state and outputting a fifth logic state, each of the other first level shifters receiving a second logic state and outputting a sixth logic state;

a plurality of second level shifters, used for boosting the voltages of inputted signals to the voltages required by high voltage components and outputting the boosted signals, one of the second level shifters receiving a third logic state and outputting a seventh logic state, each of the other second level shifters receiving a fourth logic state and outputting an eighth logic state; and a demultiplexer, used for outputting a ninth logic state and a plurality of tenth logic states according to the logic states outputted by the first level shifters and the second level shifters, wherein the demultiplexer includes a plurality of logic units; each of the logic units is coupled to one of the first level shifters and one of the second level shifters; if one of the logic units receives the fifth logic state and the seventh logic state, then the logic unit outputs the ninth logic state, otherwise the logic unit outputs the tenth logic state; the logic unit comprises:

a first switch, coupled between the first level shifter and an output terminal of the logic unit, the first switch being turned on and outputting the logic state outputted by the first level shifter if the second level shifter outputting the seventh logic state, otherwise the first switch being turned off; and a second switch, coupled between a voltage source and the output terminal of the logic unit, the second switch being turned on if the second level shifter outputting the eighth logic state, otherwise the second switch being turned off, the voltage source remaining at the tenth logic state.

* * * * *